United States Patent
Lee et al.

(10) Patent No.: US 9,184,166 B2
(45) Date of Patent: Nov. 10, 2015

(54) MANUFACTURING METHOD OF CAPACITOR STRUCTURE AND SEMICONDUCTOR DEVICE USING THE SAME

(71) Applicant: INOTERA MEMORIES, INC., Taoyuan County (TW)

(72) Inventors: Tzung-Han Lee, Taipei (TW); Yaw-Wen Hu, Taoyuan County (TW); Vishnu Kumar Agarwal, Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 0 days.

(21) Appl. No.: 14/272,804

(22) Filed: May 8, 2014

(65) Prior Publication Data

US 2015/0206883 A1    Jul. 23, 2015

(30) Foreign Application Priority Data

Jan. 20, 2014    (TW) .............................. 103101958 A

(51) Int. Cl.

| H01L 23/48 | (2006.01) |
|---|---|
| H01L 27/108 | (2006.01) |
| H01L 21/8242 | (2006.01) |
| H01L 21/331 | (2006.01) |

(52) U.S. Cl.
CPC .... *H01L 27/10814* (2013.01); *H01L 27/10852* (2013.01); *H01L 27/10885* (2013.01)

(58) Field of Classification Search
CPC ................... H01L 21/8424; H01L 27/10817; H01L 27/10852

USPC .......... 257/773, E21.651, 296, 532; 438/255, 438/309, 396, 589
See application file for complete search history.

(56) References Cited

U.S. PATENT DOCUMENTS

| 2001/0026988 A1* | 10/2001 | Matsui et al. ................. 438/381 |
| 2006/0258112 A1* | 11/2006 | Takaishi ........................ 438/396 |
| 2009/0286377 A1* | 11/2009 | Manning ....................... 438/381 |
| 2011/0086490 A1* | 4/2011 | Wang et al. .................... 438/396 |
| 2011/0159660 A1* | 6/2011 | Kang et al. .................... 438/381 |
| 2012/0193761 A1* | 8/2012 | Park et al. ..................... 257/532 |

FOREIGN PATENT DOCUMENTS

TW    201113980 A    4/2011

* cited by examiner

*Primary Examiner* — Long K Tran
*Assistant Examiner* — Dzung Tran
(74) *Attorney, Agent, or Firm* — Rosenberg, Klein & Lee

(57) ABSTRACT

The instant disclosure relates to a semiconductor device which includes a semiconductor substrate, at least one patterned reinforcing layer, a plurality of lower electrodes, and a supporting layer. The at least one patterned reinforcing layer is arranged above the semiconductor substrate, wherein the at least one patterned reinforcing layer has a plurality of reinforcing structures configured to define a plurality of alignment apertures. The lower electrodes are arranged on the semiconductor substrate, wherein N of the lower electrodes pass through each of the alignment apertures, where N is an integer greater than or equal to 1. The supporting layer is arranged above the at least one patterned reinforcing layer and between the lower electrodes.

5 Claims, 9 Drawing Sheets

MANUFACTURING METHOD OF CAPACITOR STRUCTURE AND SEMICONDUCTOR DEVICE USING THE SAME

BACKGROUND OF THE INVENTION

1. Field of the Invention

The instant disclosure relates to a manufacturing method of charge storage device; in particular, to a manufacturing method of capacitor structure and semiconductor device using the same.

2. Description of Related Art

With the vigorous development of semiconductor industry, the dimension of integrated circuit elements nowadays range from micron size to submicron size. For dynamic random access memory (DRAM), that is to say, the cross-sectional area of each capacitor and each gap between capacitors become smaller. Basically, the better operating capability of computer software becomes, the greater memory capacitance of computer hardware need. Facing up to the problem of the capacitor dimension become smaller, the memory capacitance must be increased. Thus, the traditional method of manufacturing DRAM capacitors certainly needs to be improved.

Generally, the following methods are often used to increase capacitance to store the bits of data. The first method is to decrease the dielectric constant of the dielectric material. The second method is to decrease the thickness of the dielectric layer. The third method is to increase the electrode contact-surface area. However, in view of the resolution of pattern transfer is increased and the critical dimension of the line width is reduced. Limitation exists for improving lithography by only optical improvement.

Taiwan patent no. 1399831 discloses one type of double-side capacitor structure having a plurality of supports, each of which may connect at least two adjacent lower electrodes. However, in order to integrate with high density DRAM, each capacitor must provide sufficient capacitance to maintain the signal strength. The design of DRAM will focus on the correlation between the height and thickness of the electrode and the capacitance. In summary, the increased height or the decreased thickness of the capacitor electrode will result in weakening the structural strength to cause twin bit failure.

In addition, the capacitor electrode having a large aspect ratio of height over width can make the capacitor structure, and this can lead toppling/collapsing of the capacitor electrode in wet etching process due to surface tension of the etching solution. Consequently, the yield rate would decrease prominently.

SUMMARY OF THE INVENTION

The object of the instant disclosure is to provide a manufacturing method of capacitor structure and semiconductor device using the same. Said method comprising easy steps can prevent the structure with high-aspect-ratio structures from toppling due to viscous effect of the etching solution. Hence, double-side capacitors manufactured by the method have larger electrode contact-surface area can be allowed to increase capacitance.

In order to achieve the aforementioned objects, according to an embodiment of the instant disclosure, a manufacturing method of capacitor structure comprises the following steps: providing a semiconductor substrate; forming a laminate structure on the semiconductor substrate, wherein the laminate structure includes at least one sacrificial layer and at least one patterned reinforcing layer in a stacked arrangement with respect to the at least one sacrificial layer, and wherein the at least one patterned reinforcing layer has a plurality of reinforcing structures configured to define a plurality of alignment apertures; forming a supporting layer on the laminate structure; forming a plurality of deep trenches which pass through the supporting layer and the laminate structure through the alignment apertures; forming a lower electrode to cover the inner-walls of each of the deep trenches, wherein some of the reinforcing structures scatter around the lower electrode to support its outer-side-walls; selectively removing the supporting layer, the laminate structure, and the lower electrodes to form a plurality of openings above the alignment apertures: and removing the at least one sacrificial layer of the laminate structure through the openings and the alignment apertures.

Based on the above, a semiconductor device according to one embodiment includes a semiconductor substrate, at least one patterned reinforcing layer, a plurality of lower electrodes, and a supporting layer. The at least one patterned reinforcing layer is arranged above the semiconductor substrate, wherein the at least one patterned reinforcing layer has a plurality of reinforcing structures configured to define a plurality of alignment apertures. The lower electrodes are arranged on the semiconductor substrate, wherein N of the lower electrodes pass through each of the alignment apertures, where N is an integer greater than or equal to 1. The supporting layer is arranged above the at least one patterned reinforcing layer and between the lower electrodes.

On the other hand, a semiconductor device according to another embodiment includes a semiconductor substrate, a first patterned reinforcing layer, a second patterned reinforcing layer, a plurality of lower electrodes, and a supporting layer. The first patterned reinforcing layer is arranged above the semiconductor substrate, wherein the first patterned reinforcing layer has a plurality of first reinforcing structures configured to define a plurality of first alignment apertures. The second patterned reinforcing layer is arranged above the first patterned reinforcing, wherein the second patterned reinforcing layer has a plurality of second reinforcing structures configured to define a plurality of second alignment apertures. The lower electrodes are arranged on the semiconductor substrate, wherein N of the lower electrodes pass through each of the first alignment apertures, being supported by the first reinforcing structures, and M of the lower electrodes pass through each of the second alignment apertures, being supported by the second reinforcing structures, where both N and M are integers greater than or equal to 1, and N is not equal to M. The supporting layer is arranged above the second patterned reinforcing layer and between the lower electrodes.

In conclusion, the laminate structure formed on the semiconductor substrate includes at least one patterned reinforcing layer configured to improve the structural strength of capacitor lower electrodes. Specifically, the amount of the patterned reinforcing layer is proportional to the electrode height. Therefore, the instant disclosure not only can increase electrode contact-surface area to increase capacitance, but also can simplify the manufacturing process to improve the production yield.

Moreover, the reinforcing structures of the at least one patterned reinforcing layer can be configured to define a plurality of alignment apertures, and the capacitor trenches can be formed self-aligningly in the laminate structure through the alignment apertures. Hence, memory cell capacitors can be well placed to avoid shifting.

In order to further appreciate the characteristics and technical contents of the instant disclosure, references are here-

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
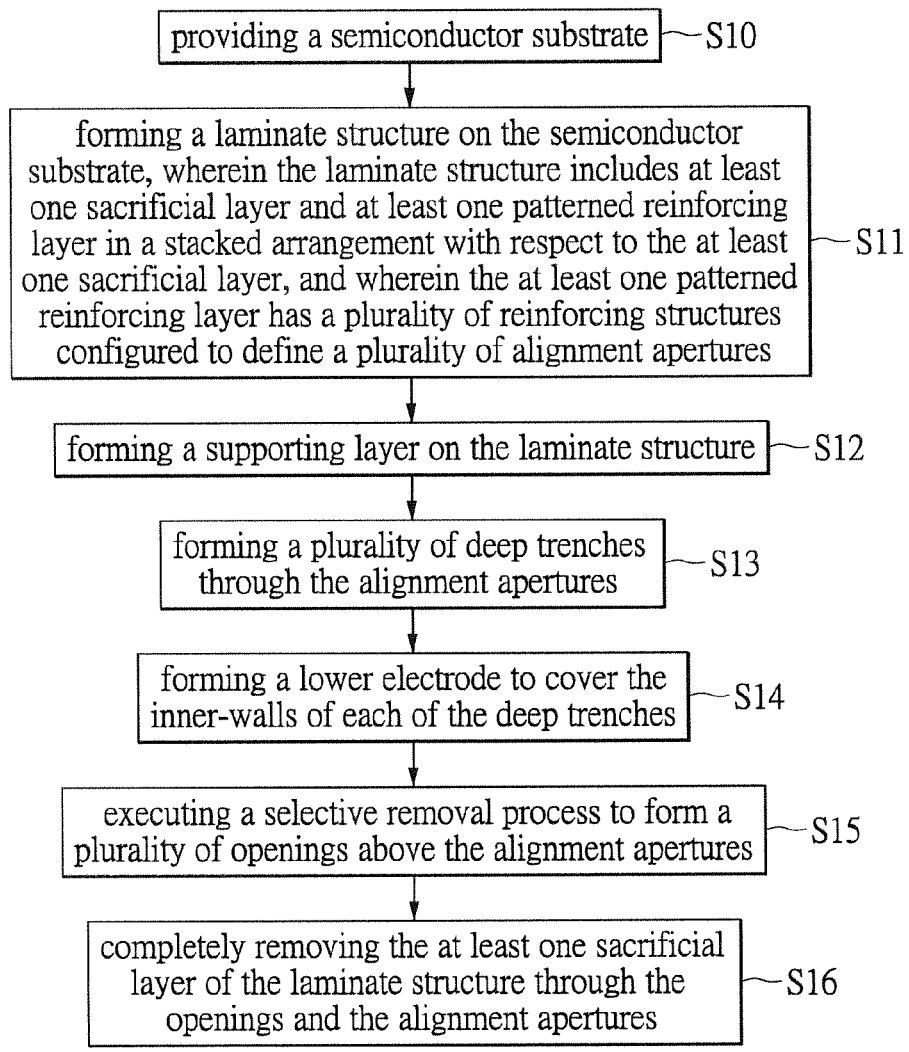
FIG. 1 is a process diagram of the manufacturing method of capacitor structure according to an embodiment of the instant disclosure.
Figure 2:
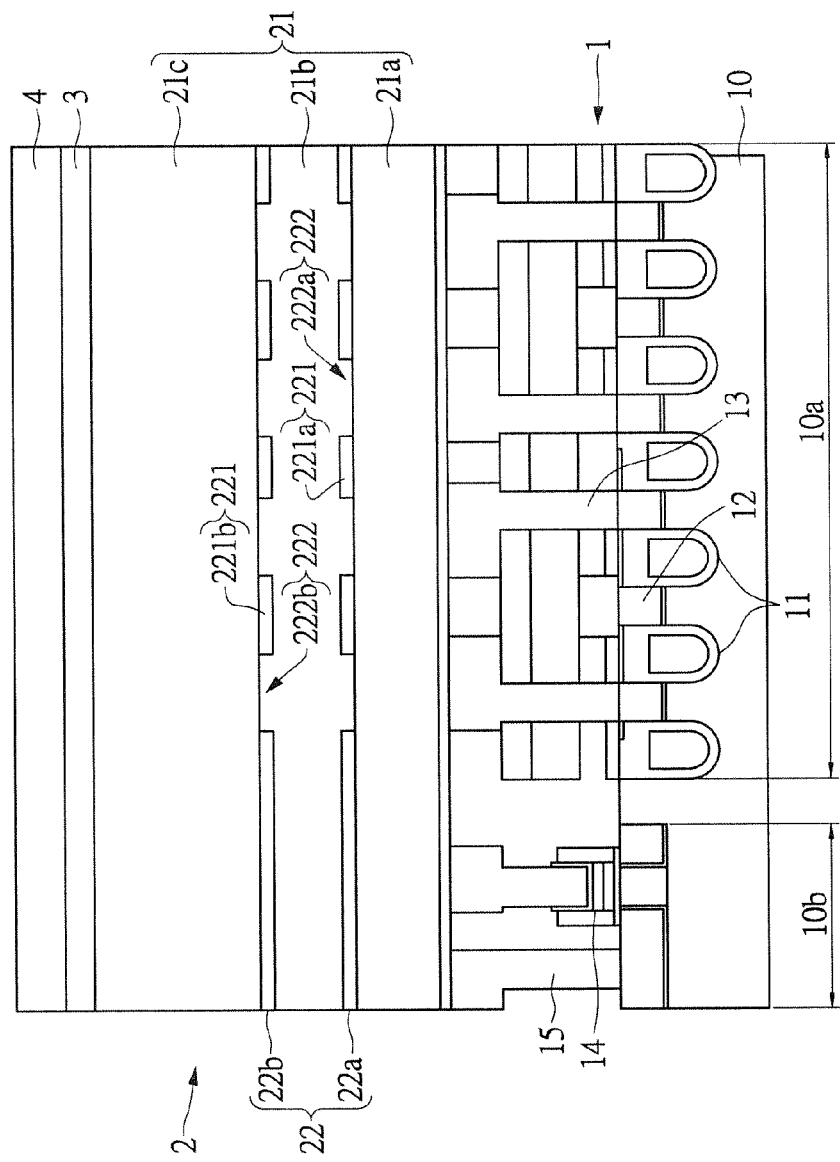
FIG. 2 is a cross-sectional diagram illustrating the flow of the prior fabrication stage of the manufacturing method of capacitor structure according to an embodiment of the instant disclosure.

Please refer to FIG. 1 as well as FIGS. 2 and 4-7. FIG. 1 is a process diagram of the method of capacitor structure. FIGS. 2 and 4-7 are cross-sectional diagrams showing the capacitor structure and the flow of the prior fabrication stages. The method comprises the following steps:

Referring to FIG. 2, the first step S10 is to provide a semiconductor substrate 1. The semiconductor substrate 1 has an array region 10a and at least one peripheral region 10b outside the array region 10a. There is a plurality of buried bit lines 11, a plurality of bit line contacts 12, and a plurality of conductive structures 13 formed in the array region 10a. There is a plurality of transistors 14 and a plurality of conductive structures 15 formed in the peripheral region 10b. In practice, the elements mentioned above can be formed by any other traditional method, so the repetitious details need not be given here.

Concretely speaking, the method of providing a semiconductor substrate 1 comprises the following steps. A substrate 10 is provided in the beginning. A plurality of buried bit lines 11 are formed in the substrate 10 in the second place. Then, a plurality of bit line contacts 12 are formed in the substrate 10 at intervals of the buried bit lines 11. After that, a plurality of conductive structures 13 are formed on the bit line contacts 12 respectively for electrically connecting to subsequently formed lower electrodes (not shown).

In practice, the transistors 14 can be, but not limited to, metal oxide semiconductor transistors (MOS transistors). The conductive structures 15 can be served as the conductive plugs for electrically connecting with the source/drain contact regions (not shown). The transistors 14 and the conductive structures 15 in the peripheral region 10b can be formed during or after the processing steps mentioned above.

Next, the step S11 is to form a laminate structure 2 on the semiconductor substrate 1. Referring again to FIG. 2, the laminate structure 2 consists of at least one sacrificial layer 21 and at least one patterned reinforcing layer 22 in a stacked arrangement with respect to the at least one sacrificial layer 21. It is notable that the at least one patterned reinforcing layer 22 having a plurality of reinforcing structures 221 which not only can enhance the structural strength of the capacitor lower electrode, but also can define the capacitor landing areas to increase yield rate. It is mainly because of the reinforcing structures 221 can define a plurality of alignment apertures 222 to accurately place well-defined capacitors. In this way, memory cell capacitors can be integrated much more simply and easily.

Figure 3A:
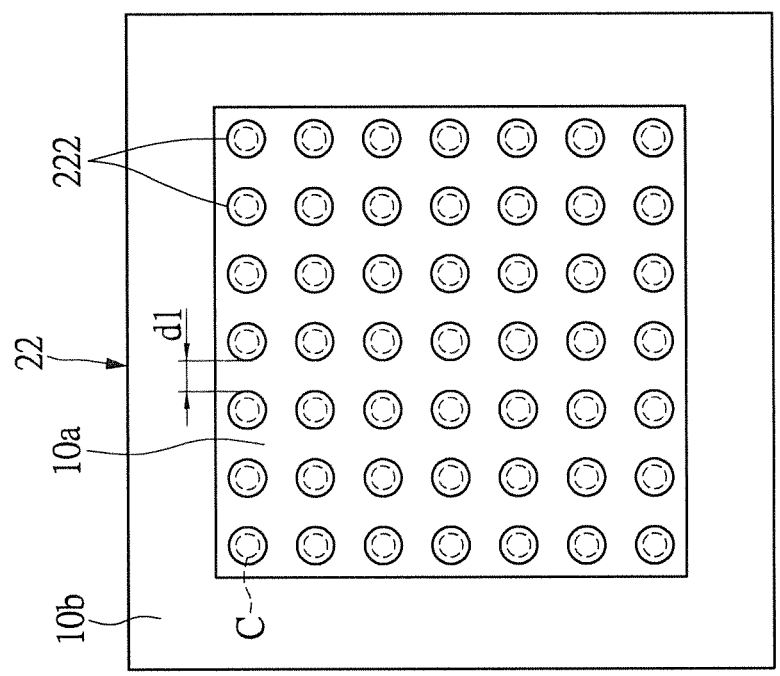
FIGS. 3A-3C are top diagrams showing the patterned reinforcing layer according to an embodiment of the instant disclosure.
Figure 3B:
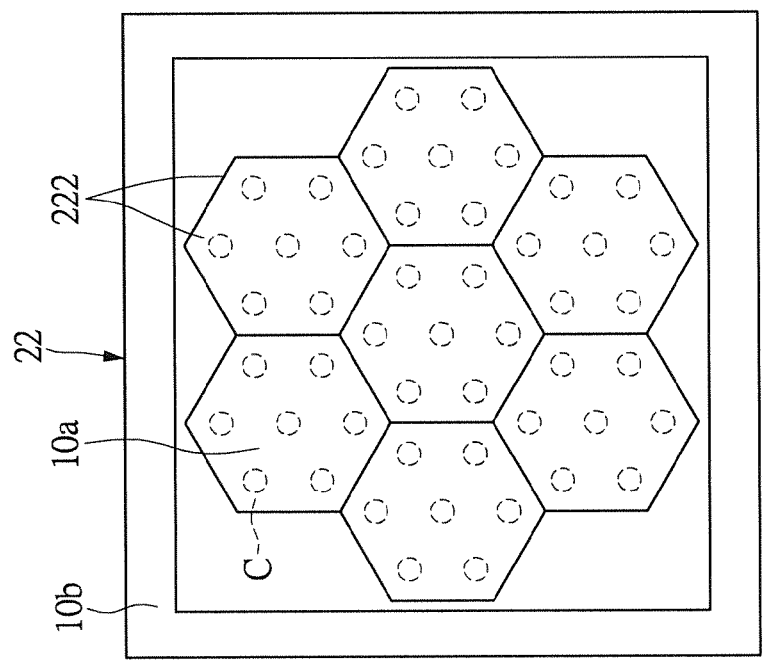
Figure 3C:
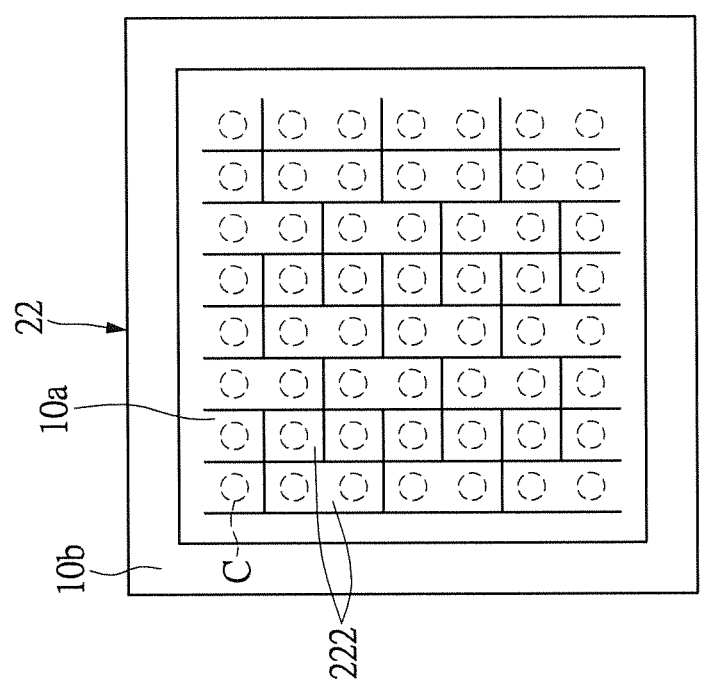

Referring to FIG. 3A, the patterned reinforcing layer 22 according to one embodiment formed with a plurality of the alignment apertures 222 in a matrix arrangement. Specifically, any adjacent two of the alignment apertures 222 have a spacing distance d1 therebetween, and each of the alignment apertures 222 can define a capacitor landing area C. That is, spacing between adjacent capacitor landing areas C is substantially uniform. Referring to FIG. 3B, the patterned reinforcing layer 22 according to another embodiment formed with a plurality of the alignment apertures 222 in a hive-like arrangement which is an example of a regular array. Specifically, each of the alignment apertures 222 shaped like a hexagon can be configured to define N capacitor landing areas C, where N is an integer greater than 1. Referring to FIG. 3C, the patterned reinforcing layer 22 according to still another embodiment formed with a plurality of the alignment apertures 222 in a random arrangement. Specifically, each of the alignment apertures 222 shaped like a rectangle can be configured to define M capacitor landing area(s) C, where M is an integer greater than or equal to 1.

Referring again to FIG. 2, for the purpose of increasing the aspect-ratio of the capacitor to increase its capacitance, the method of forming a laminate structure 2 on the semiconductor substrate 1 comprises the following steps. First, a first sacrificial layer 21a is formed on the semiconductor substrate 1. In practice, the material of the first sacrificial layer 21a includes, for example, boro-phosphosilicate glass (BPSG), phosphosilicate glass (PSG), undoped silicate glass (USG), and/or tetra-ethyl-ortho silicate glass (TEOS) and can be formed by any traditional deposition process. Next, a first patterned reinforcing layer 22a is formed over the first sacrificial layer 21a, wherein the first patterned reinforcing layer 22a has a plurality of first reinforcing structures 221a formed by a photolithography process and an etching process. It is notable that the first reinforcing structures 221a not only can support each electrode structure of the subsequently formed capacitors, but also can define a plurality of first alignment apertures 222a. The first alignment apertures 222a can be, but not limited to, circular, triangle, rectangular, pentagon, or hexagon shaped, the second alignment apertures are circular, triangle, rectangular, pentagon, or hexagon shaped.

Next, a second sacrificial layer 21b is formed over the first patterned reinforcing layer 22a. In practice, the material of the second sacrificial layer 21b can be the same as or different from the first sacrificial layer 21a based on the process requirement such as etching selectivity. Next, a second patterned reinforcing layer 22b is formed over the second sacrificial layer 22a, wherein second patterned reinforcing layer 22b has a plurality of second reinforcing structures 221b formed by a photolithography process and an etching process. In the same way, the second reinforcing structures 221b not only can support each electrode structure of the subsequently formed capacitors, but also can define a plurality of second alignment apertures 222b. The second alignment apertures 222b can be, but not limited to, circular, triangle, rectangular, pentagon, or hexagon shaped, the second alignment apertures are circular, triangle, rectangular, pentagon, or hexagon shaped. Finally, a third sacrificial layer 21c is formed over the second patterned reinforcing layer 22b. In practice, the material of third sacrificial layer 21c can be the same as or different from the first sacrificial layer 21a and the second sacrificial layer 21b based on the process requirement such as etching selectivity.

In addition, the shape of the first alignment apertures 222a can be the same as or different from the shape of the second alignment apertures 222b, and the amount of the capacitor landing area(s) C defined by each first alignment aperture 222a can be equal to the amount of the capacitor landing area(s) C defined by each second alignment aperture 222b or not. In other words, any method that forming a patterned reinforcing layer to simultaneously define capacitor landing areas and support capacitor electrode structures falls within the scope of the instant disclosure.

Next, the step S12 is to sequentially form a supporting layer 3 and a hard mask layer 4 on the laminate structure 2. Referring again to FIG. 2, the material of the supporting layer 3 includes, for example, silicon nitride and/or silicon oxynitride, and the hard mask layer 4 can be composed of oxide containing material.

Figure 4:
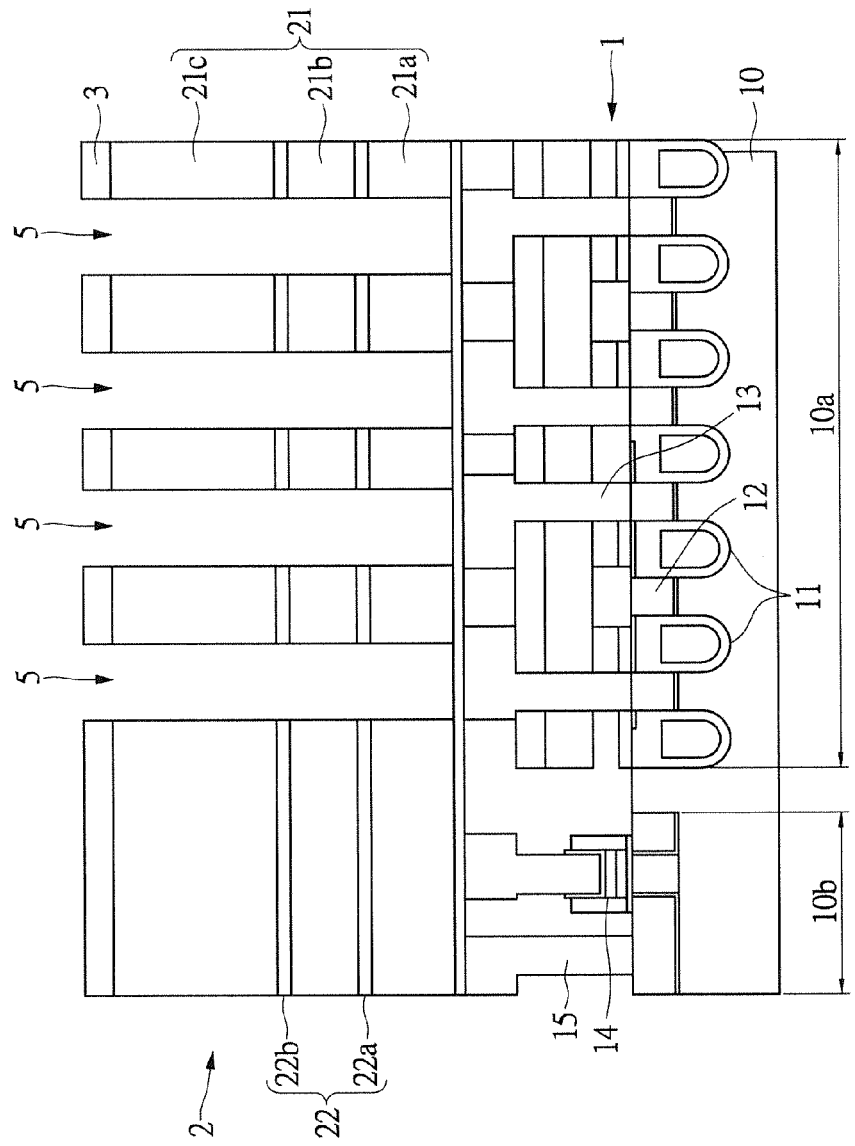
FIGS. 4-7 are cross-sectional diagrams illustrating the flow of the posterior fabrication stage of the manufacturing method of capacitor structure according to an embodiment of the instant disclosure.

Next, the step S13 is to form a plurality of deep trenches 5 through the alignment apertures 222. Referring to FIGS. 2 and 4, the method of forming a plurality of deep trenches 5 comprises the following steps. The first step is patterning the hard mask layer 4 to define the array pattern of capacitors. The next step is selectively removing the supporting layer 3 and the laminate structure 2 with the patterned hard mask layer 4 as a mask using the etching gas that exists high selectivity for the material of the supporting layer 3 and the laminate structure 2 to form the deep trenches 5 there-through.

In a preferred embodiment, in the step S13, N of the deep trenches 5 self-aligningly pass through the supporting layer 3 and the laminate structure through 2 the first alignment apertures 222a, where N is an integer greater than or equal to 1. On the other hand, M of the deep trenches 5 pass through the supporting layer 3 and the laminate structure 2 through the second alignment apertures 222b, where M is an integer greater than or equal to 1, and M is not equal to N.

Figure 5:
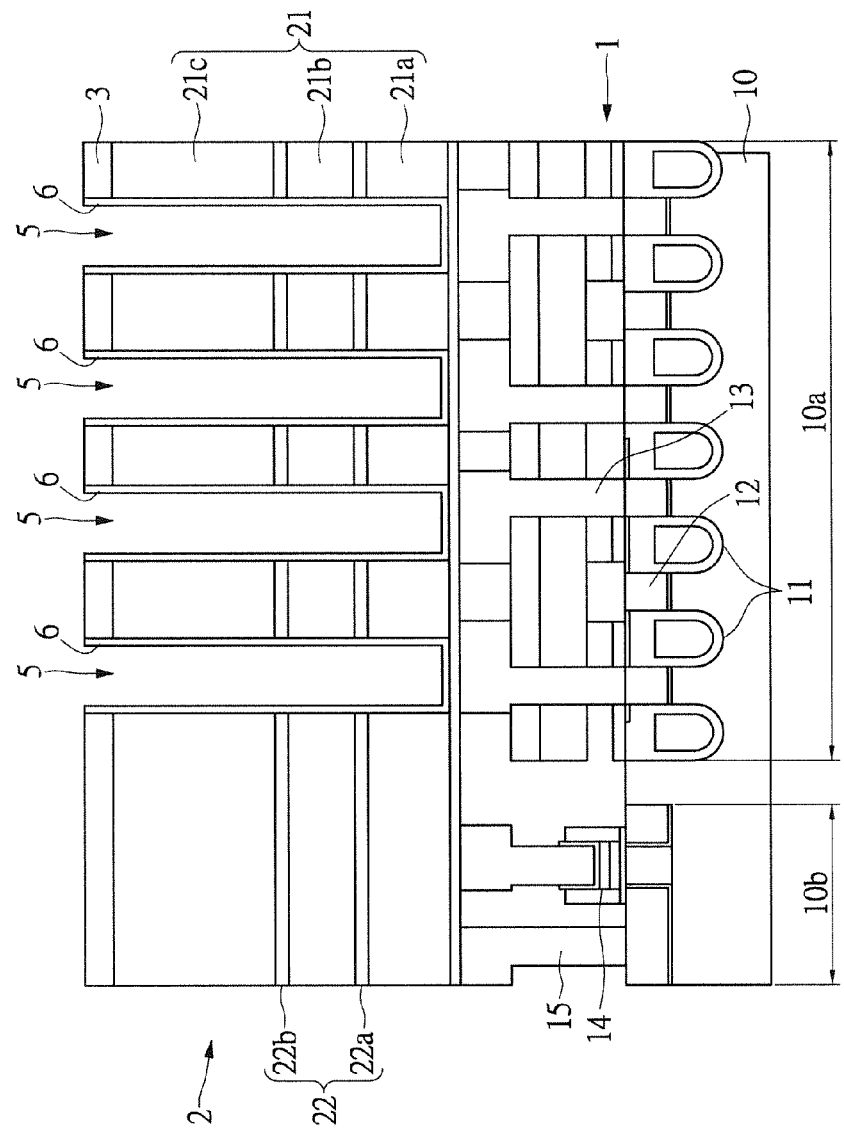

Next, the step S14 is to form a lower electrode 6 to cover the inner-walls of each of the deep trenches 5. Referring to FIGS. 2 and 5, the method of forming a lower electrode 6 to cover the inner-walls of each of the deep trenches 5 comprises the following steps. A conductive material such as titanium nitride is formed to continually cover the exposed surface of the supporting layer 3 and the inner-walls of each of the deep trenches 5 in the beginning. Then, a chemical polishing process is conducted to remove a portion of the conductive material on the exposed surface of the supporting layer 3. Consequently, the remained conductive material can be designed to serve as the lower electrodes 6, each of which can be, but not limited to, hallow-cylinder shaped. It is notable that some of the reinforcing structures 221 of the reinforcing layer 22 scatter around each of the lower electrodes 6 can be configured to support its outer-side-walls to avoid toppling in wet etching due to surface tension of the etching solution.

Figure 6:
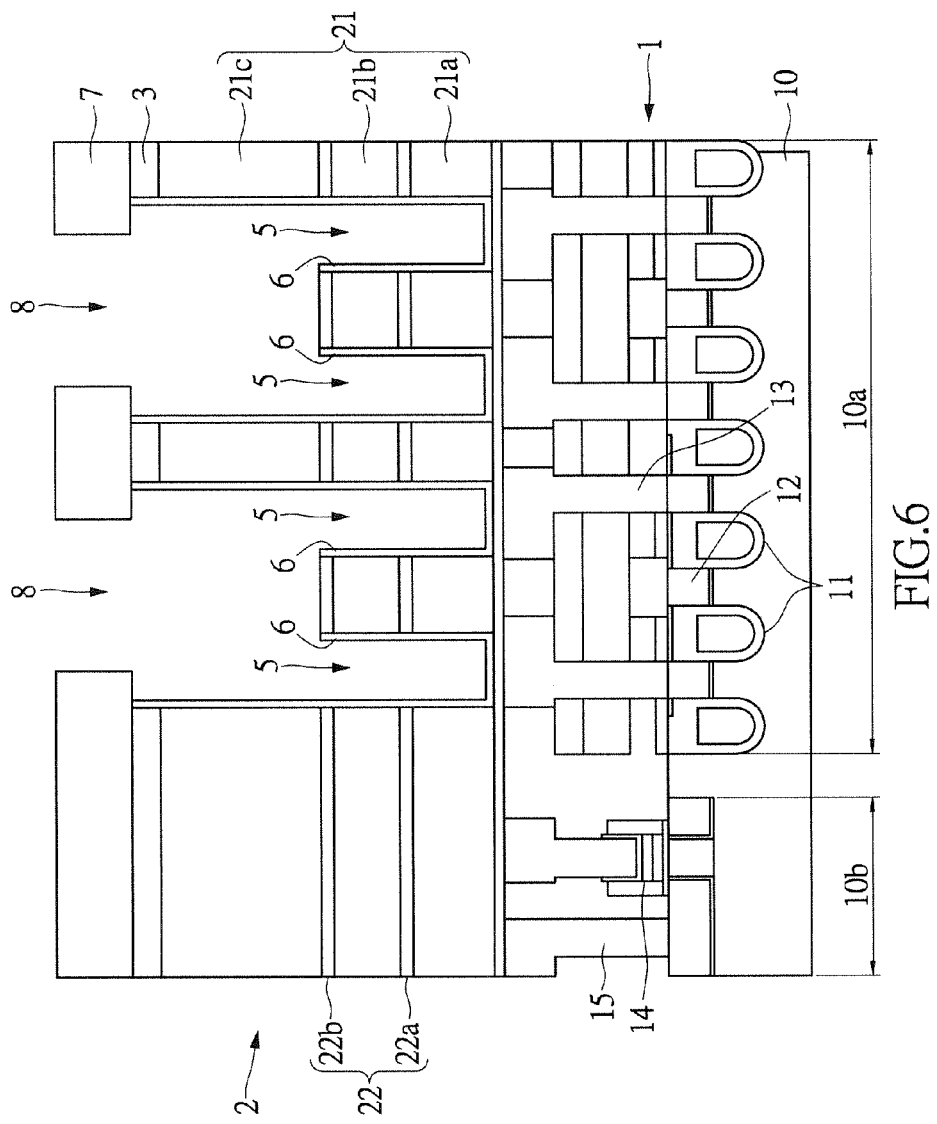

Next, the step S15 is to execute a selective removal process to form a plurality of openings 8 above the alignment apertures 222. Referring to FIG. 6, the method of forming a plurality of openings 8 comprises the following steps. A patterned photoresist layer 7 is formed on the supporting layer 3 to define the pattern of the openings 8 in the beginning. An etching process is conducted to partially remove the supporting layer 3, the third sacrificial layer 22c, and the lower electrodes 6 to form the openings 8. Lastly, a dry or wet photoresist strip process is conducted to remove the patterned photoresist layer 7.

Figure 7:
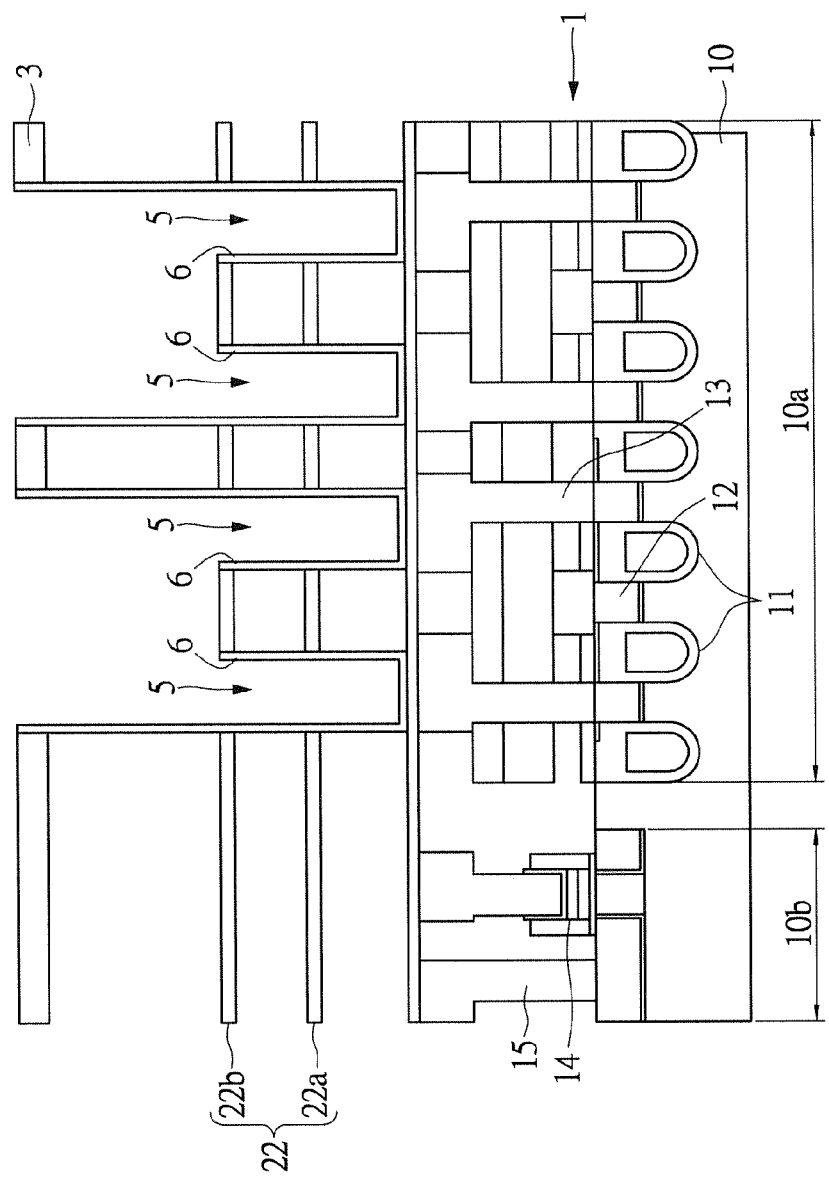

Finally, the step S16 is to completely remove the at least one sacrificial layer 21 of the laminate structure 2 through the openings 8 and the alignment apertures 222. Referring to FIGS. 2 and 7, in practice, the etching solution with high selectivity for the material of the first, second, and third sacrificial layers 21a, 21b, 21c can be used. Further, the first, second, and third sacrificial layers 21a, 21b, 21c are completely removed through the first and second alignment apertures 222a, 222b by the etching solution without an additional etching definition step with photoresist. It is notable that the remained first and second reinforcing structures 222a, 222b can be configured to support the lower electrodes 6.

Please refer to FIGS. 2 and 7 again, the technical features of the method of capacitor structure are exemplarily explained above. The instant disclosure further relates to a semiconductor device which includes a semiconductor substrate 1, a first patterned reinforcing layer 22a, a second patterned reinforcing layer 22b, a plurality of lower electrodes 6, and a supporting layer 3.

Concretely speaking, the first patterned reinforcing layer 22a is arranged above the semiconductor substrate 1, wherein the first patterned reinforcing layer 22a has a plurality of first reinforcing structures 221a configured to define a plurality of first alignment apertures 222a. The second patterned reinforcing layer 22b is arranged above the first patterned reinforcing 22a, wherein the second patterned reinforcing layer 22b has a plurality of second reinforcing structures 221b configured to define a plurality of second alignment apertures 222b.

The lower electrodes 6 are arranged on the semiconductor substrate 1, wherein N of the lower electrodes 6 pass through each of the first alignment apertures 222a, being supported by the first reinforcing structures 221a, and M of the lower electrodes 6 pass through each of the second alignment apertures 222b, being supported by the second reinforcing structures 221b, where both N and M are integers greater than or equal to 1, and N is not equal to M. The supporting layer 3 is arranged above the second patterned reinforcing layer 22b and between the lower electrodes 6.

Moreover, the semiconductor substrate 1 includes a substrate 10, a plurality of buried bit lines 11, a plurality of bit line contacts 12, and a plurality of conductive structures 13. The buried bit lines 11 are arranged in the substrate 10. The bit line contacts 12 are arranged in the substrate 10 at intervals of the buried bit lines 11. The conductive structures 13 are arranged on the bit line contacts 12 respectively for electrically connecting to the lower electrodes 6.

Based on above, the manufacturing method of capacitor structure and the semiconductor device using the same, in comparison with the traditional method and semiconductor device, have the following advantages.

Firstly, the laminate structure formed on the semiconductor substrate includes at least one patterned reinforcing layer configured to improve the structural strength of capacitor lower electrodes. Specifically, the amount of the patterned reinforcing layer is proportional to the electrode height. Therefore, the instant disclosure not only can increase electrode contact-surface area to increase capacitance, but also can omit an additional etching definition step with photoresist to improve the production yield.

Secondly, the reinforcing structures of the at least one patterned reinforcing layer can be configured to define a plurality of alignment apertures, and the capacitor trenches can be formed self-aligningly in the laminate structure through the alignment apertures. Hence, memory cell capacitors can be well placed to avoid shifting.

Further, the reinforcing structures of the at least one patterned reinforcing layer disposed at the outer-sidewalls of the lower electrodes can be used to support the capacitor lower electrodes. Thus, the toppling/collapsing problem of the capacitor electrode having a large aspect ratio of height over width in wet etching process due to surface tension of the etching solution can be solved.

Finally, the capacitor structures manufactured by the instant method have larger electrode contact-surface area and high intensity. Accordingly, the miniature and high-performance semiconductor device can be achieved.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A semiconductor device, comprising:
   a semiconductor substrate;
   at least one patterned reinforcing layer arranged above the semiconductor substrate, wherein the at least one patterned reinforcing layer has a plurality of reinforcing structures configured to define a plurality of alignment apertures;
   a plurality of lower electrodes arranged on the semiconductor substrate, wherein N of the lower electrodes pass through each of the alignment apertures, where N is an integer greater than or equal to 2; and
   a supporting layer arranged above the at least one patterned reinforcing layer and between the lower electrodes.

2. The semiconductor device according to claim 1, wherein the semiconductor substrate includes a substrate, a plurality of buried bit lines, a plurality of bit line contacts, and a plurality of conductive structures, the buried bit lines are arranged in the substrate, the bit line contacts are arranged in the substrate at intervals of the buried bit lines, the conductive structures are arranged on the bit line contacts respectively for electrically connecting to the lower electrodes.

3. A semiconductor device, comprising:
   a semiconductor substrate;
   a first patterned reinforcing layer arranged above the semiconductor substrate, wherein the first patterned reinforcing layer has a plurality of first reinforcing structures configured to define a plurality of first alignment apertures;
   a second patterned reinforcing layer arranged above the first patterned reinforcing, wherein the second patterned reinforcing layer has a plurality of second reinforcing structures configured to define a plurality of second alignment apertures;
   a plurality of lower electrodes arranged on the semiconductor substrate, wherein N of the lower electrodes pass through each of the first alignment apertures, being supported by the first reinforcing structures, and M of the lower electrodes pass through each of the second alignment apertures, being supported by the second reinforcing structures, where both N and M are integers greater than or equal to 2, and N is not equal to M; and
   a supporting layer arranged above the second patterned reinforcing layer and between the lower electrodes.

4. The semiconductor device according to claim 3, wherein the first alignment apertures are circular, triangle, rectangular, pentagon, or hexagon shaped, the second alignment apertures are circular, triangle, rectangular, pentagon, or hexagon shaped.

5. The semiconductor device according to claim 3, wherein the semiconductor substrate includes a substrate, a plurality of buried bit lines, a plurality of bit line contacts, and a plurality of conductive structures, the buried bit lines are arranged in the substrate, the bit line contacts are arranged in the substrate at intervals of the buried bit lines, the conductive structures are arranged on the bit line contacts respectively for electrically connecting to the lower electrodes.

* * * * *